United States Patent

Shamash et al.

[15] 3,683,105

[45] Aug. 8, 1972

[54] MICROCIRCUIT MODULAR PACKAGE

[72] Inventors: Maurice B. Shamash, Randallstown; William W. Staley, Pasadena; Charles I. Denton, Ellicott City, all of Md.; Fred D. Walton, Playa-del-Rey, Calif.

[73] Assignee: Westinghouse Electric Corporation, Pittsburgh, Pa.

[22] Filed: Oct. 13, 1970

[21] Appl. No.: 80,392

[52] U.S. Cl. ....................174/68.5, 29/589, 29/626, 174/DIG. 3, 317/101 CC, 317/101 CM

[51] Int. Cl. ..............................................H05k 3/36

[58] Field of Search................174/68.5, DIG. 3, 525; 317/101 A, 101 CC, 101 CM, 101 CE, 234 G; 29/626, 588–590

[56] References Cited

UNITED STATES PATENTS 3,390,308 6/1968 Marley...........174/DIG. 3 UX 3,436,604 4/1969 Hyltin et al............317/101 A

OTHER PUBLICATIONS

" Technical Description of Interconnection System for Motorola Main-Frame Semiconductor Memory," 3R.D. published by Motorola, Inc., Nov. 19, 1969

*Primary Examiner*—Darrell L. Clay

*Attorney*—F. H. Henson and E. P. Klipfel

[57] ABSTRACT

Method and apparatus whereby the interconnection of integrated circuit chips is obtained by means of multilayers of microcircuit conductors fabricated on at least one flexible dielectric film. Metallized conductors are fabricated and selectively connected on both sides of the film by means of metallized throughholes. One or more integrated circuit chips are bonded and interconnected to the flexible film and the sub-assembly is then bonded and interconnected to a ceramic substrate sub-assembly which also contains appropriate metallized conductors thereon. The substrate additionally includes an insulating dielectric layer intermediate the opposing metallizations between the substrate and the lower surface of the flexible dielectric film and includes selected windows fabricated therein so that appropriate interconnection between the substrate conductors and the flexible film conductors can be accomplished by thermocompression bonding while at the same time preventing undesired shorting between opposing metallizations. The integrated chip may be mounted on either face of the flexible dielectric film or when desirable bonded to the substrate.

13 Claims, 11 Drawing Figures

MICROCIRCUIT MODULAR PACKAGE

The invention herein described was made in the course of or under a contract or subcontract thereunder with the Department of the Navy (NAVAIRDEVCEN CONTRACT N62269-68-C-0684.

BACKGROUND OF THE INVENTION

1. Field of the Invention

This invention relates generally to microminiature electronic circuitry and more particularly to the interconnection of multifunctional integrated circuit chips in a hybrid microcircuit modular package.

2. Description of the Prior Art

The current trend in electronic design and mechanical packaging of circuit elements is in the direction of multifunctional microelectronic packages. Interconnection is normally accomplished by mounting bare integrated circuit chips on dielectric substrates and interconnecting the chips with the metallization and wire or face bonding techniques. Because of the small size, the interconnecting microcircuitry is frequently needed in multilayer form in order to make the proper electrical connection.

One prior art method for accomplishing the multilayers of interconnections employs alternate layers of metallization and insulation on a rigid substrate usually ceramic. This process requires numerous fabrication steps for materials deposition, photo masking for patterns, and etching of both metal and dielectric layers. Expensive and difficult processes such as vacuum sputtering for dielectric materials deposition are also required. One of the problems involved in such techniques, however, is the occurrence of pinholes in the dielectric layers. In addition, face bonded chips must have a bump or beam lead configuration, thus putting restraints on chip selection. Face bonded chips, moreover, with bumps are not visually inspectable for joint integrity. To overcome the various problems encountered in making such interconnections, the use of various types of plastic dielectric sheets or films has been resorted to. Typical examples are disclosed in such patents as U.S. Pat. No. 3,474,297 issued to E. G. Bylander, U.S. Pat. No. 3,312,871 issued to H. Seiki, et al. and U.S. Pat. No. 3,390,308 issued to J. Marley.

While the aforesaid prior art operates in the respective intended manner, the present invention is directed to still a new and an improved microcircuit interconnection technique that permits multilayer interconnection capability through the use of discrete metallized flexible dielectric films upon which all types of bare integrated circuit chips and discrete resistor and capacitor chips may be interconnected.

SUMMARY

Briefly, the subject invention is directed to the method and apparatus for interconnecting multifunctional microelectronic circuitry through the use of a metallized flexible dielectric film in conjunction with a rigid ceramic substrate. The substrate which is composed of alumina, beryllia or other suitable material includes a first layer of metallization produced on the surface of the substrate in a selected conductor pattern. A first or insulating dielectric layer preferably comprised of amide-imide or other selected polymer liquid film is applied over the metallization of the surface of the substrate and appropriate windows or hole pattern is produced therein exposing selected portion of the metallization. When desirable, however, a prefabricated solid dielectric film may be placed over the first layer of metallization. Next, a second or flexible dielectric film composed of material such as polypyromellitimide plastic (H-film), polyethylene terephthalate (Mylar), amide-imide or other suitable material is processed to provide a selected pattern of throughholes. The flexible film is subsequently processed using techniques such as vacuum deposition and/or plating to produce metallization in selected conductor patterns on both sides of the film as well as in the throughholes in an uninterrupted second and third layer of metallization respectively. An integrated circuit chip having any desired type of lead configuration for electrical connection is bonded by means of suitable thermocompression or ultrasonic bonding techniques to one surface of the flexible film so that a desired electrical interconnection is made therewith. The chip may be bonded to the upper or lower surface of the film depending upon the particular configuration desired. The flexible film with the chip attached is next placed on the substrate so that selected registration is achieved between selected conductors of the lower or second layer of metallization of the flexible film and selected conductors of the first layer of metallization on the surface of the substrate as determined by the windows or openings in the first dielectric layer. Finally, a thermocompression bonding tool is applied to the top of the flexible film whereupon selected electrical interconnection is made between the second layer metallization on the lower surface of the flexible film with the first layer of metallization on the of the ceramic substrate completing the electrical interconnection of the chip to conductors on the substrate. After electrical testing, the assembly is hermetically sealed and ready for use.

DESCRIPTION OF THE PREFERRED EMBODIMENT

Figure 1:
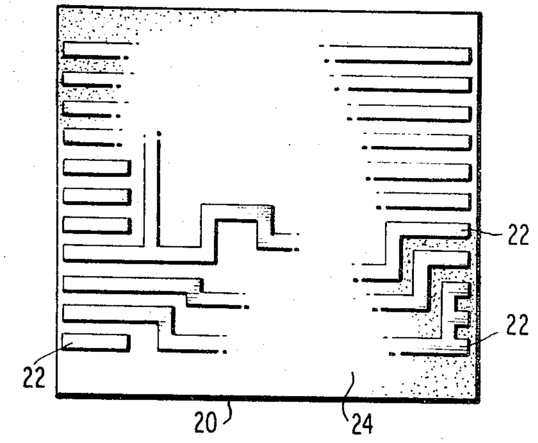
FIG. 1 is a top plan view of a ceramic substrate including a first layer of metallization fabricated in a predetermined conductor pattern on the surface thereof.
Figure 2:
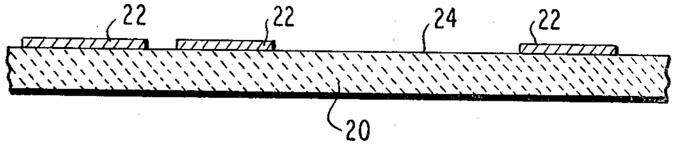
FIG. 2 is a fragmentary cross-sectional view of the substrate and metallization shown in FIG. 1.

Referring now to the drawings and more particularly to FIGS. 1 and 2, there is disclosed a base substrate 20 comprised of rigid ceramic such as alumina, beryllia or other similar insulating material. A first layer of metallization 22 is produced thereon in a predetermined conductor pattern on the upper surface 24 of the substrate. Any desired type of metallization material may be used; however, an example of a preferred material is a composition made from molybdenum manganese and gold. A typical method of obtaining the desired conductor pattern is by etching the pattern on the surface 24 after a layer of metallization material has been deposited on the surface thereof by well known state of the art techniques.

Figure 3:
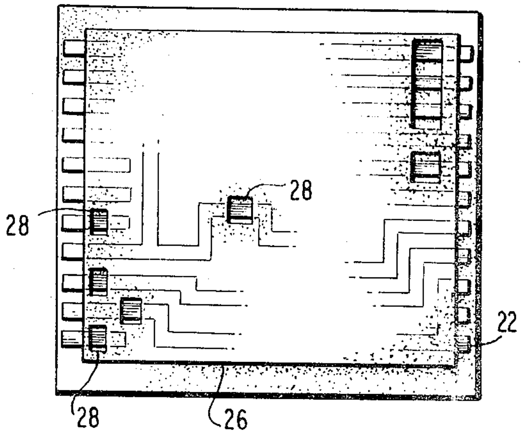
FIG. 3 is a top plan view of the ceramic substrate shown in FIG. 1 and additionally including a first or insulating dielectric layer applied over the metallization and additionally including selected windows therein exposing selected regions of conductors.
Figure 4:
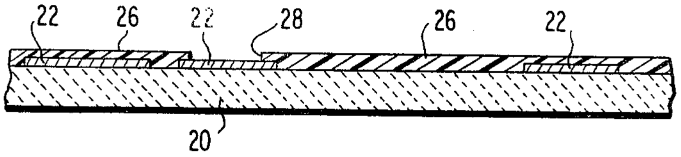
FIG. 4 is a fragmentary cross-sectional view of the sub-assembly shown in FIG. 3.
Figure 5:
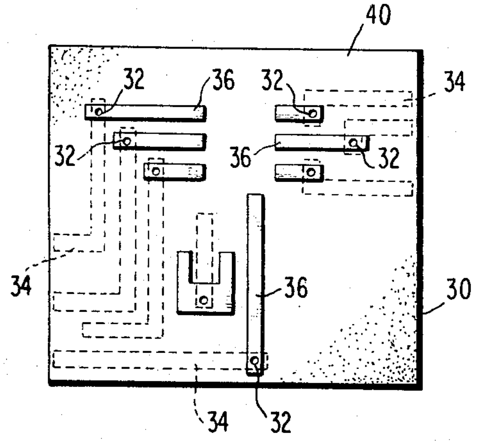
FIG. 5 is a top plan view of a second or flexible dielectric layer or film with second and third layers of metallization respectively applied on both sides thereof in conductor patterns including metallized feedthrough holes making interconnection between selected conductors of the second and third layer of metallization.
Figure 6:
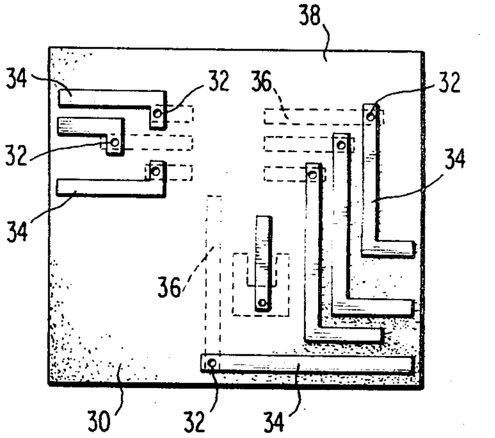
FIG. 6 is a bottom plan view of the flexible dielectric film shown in FIG. 5 illustrating the conductor pattern of the second or lower layer of metallization.

Next a first or insulating dielectric layer 26 is applied over the first layer of metallization 22 as shown in FIGS. 3 and 4. This insulating dielectric layer is preferably comprised of, for example, amide-imide and is applied as either a prefabricated dielectric solid film having a preselected hole or window pattern including the windows 28 therein or it may be fabricated on the substrate 20 by applying a liquid polymer film over the surface 24 and the metallization 22, drying it, and then etching the required hole pattern in the dried film.

Having thus fabricated the ceramic substrate 20, as shown in FIGS. 3 and 4, a second or flexible dielectric layer or film 30 preferably comprised of polypyromellitimide plastic commonly referred to as H-film and sold under the trademark "Kapton" by DuPont is processed to provide a selected pattern of throughholes 32. This hole pattern may be obtained by punching, drilling, or etching as desired; however, etching is preferably employed due to the fact that punching and drilling is normally a more expensive procedure. The flexible dielectric film 30 is preferably comprised of polypyromellitimide plastic because of its etchable and high temperature characteristics. This is not meant to be interpreted in a restricted sense, since other materials such as polyethylene terephthalate and amide-imide may also be used when desirable.

Second and third layers 34 and 36 of metallization in the form of predetermined conductor patterns are respectively fabricated on the lower and upper sides 38 and 40 of the dielectric film 30 with metallization in the throughholes 32 so that metallization is applied on both sides of the film and in the throughholes in an uninterrupted fashion whereby interconnection between selected conductors on side 38 is made with selected conductors on side 40 of the flexible dielectric film. This process can be accomplished using such well known processes as vacuum deposition and/or plating. Normally, the dielectric film 30 having the throughhole pattern has metallization applied on both sides of the film and in the throughholes with the final interconnecting conductor pattern being produced subsequently using photo-etching techniques.

Figure 7:
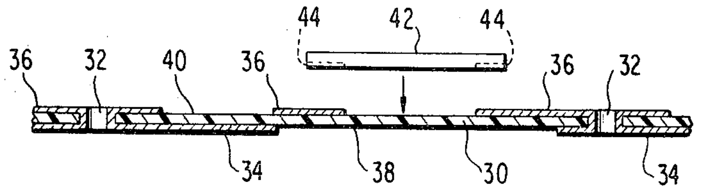
FIG. 7 is a fragmentary cross-sectional view of the flexible dielectric film shown in FIGS. 5 and 6 including an integrated circuit chip which is adapted to be attached to conductors of the third or upper layer of metallization.
Figure 8:
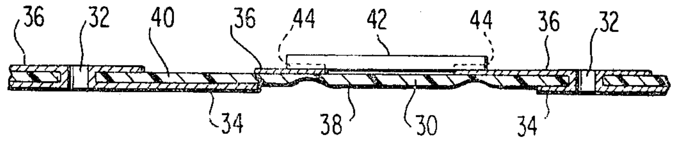
FIG. 8 is a fragmentary cross-sectional view of a subassembly including a flexible dielectric film shown in FIG. 7 with the integrated circuit chip bonded thereto.

Having fabricated the flexible dielectric film with the second and third layers of metallization in the required conductor patterns, a bare integrated circuit chip 42 having, for example, metallization connector pads 44 on the underside thereof is bonded by means of the pads to selected conductors of the third layer of metallization 36 on the upper side 40 of the flexible film 30 by means of thermocompression or ultrasonic energy applied to the underside 38. It should be understood that the configuration shown in FIGS. 7 and 8 is merely by way of example, since when desirable, the integrated circuit chip 42 may be bonded to the second layer of metallization 34 on the underside of the flexible film 30 or to the substrate 20 itself. The integrated chip 42 however is always electrically connected to one of the layers of metallization on the flexible film 30, instead of the first layer of metallization 22 on the substrate and as a result the particular type of output lead configuration associated with the chip becomes immaterial, since in addition to the pad metallization 44 shown in FIGS. 7 and 8, integrated circuit chips including bump or beam lead configurations are also adapted to be bonded to the flexible film 30 in substantially the same manner.

Figure 9:
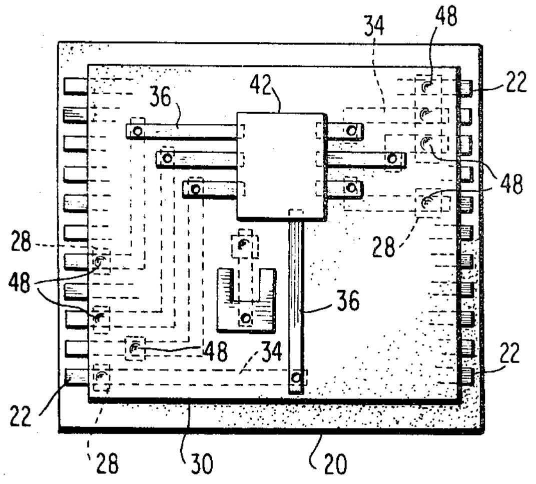
FIG. 9 is a top plan view of a complete assembly of the subject invention.
Figure 10:
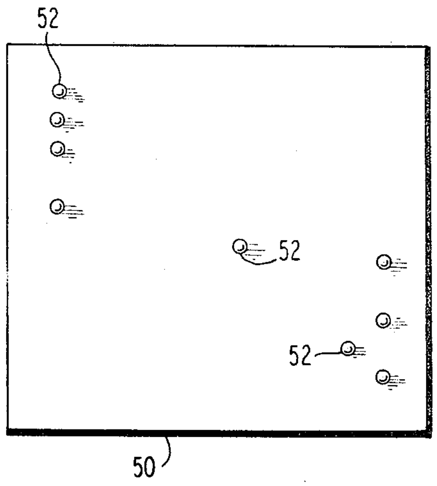
FIG. 10 is a bottom plan view of a thermocompression bonding tool utilized in completing the assembly shown in FIG. 9.
Figure 11:
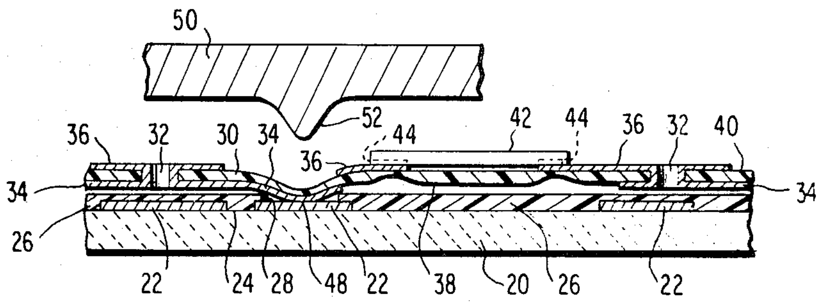
FIG. 11 is a fragmentary cross-sectional view of the assembly shown in FIG. 9 in combination with the thermocompression bonding tool shown in FIG. 10.

After chip attachment is completed, the flexible film sub-assembly which for example is shown in FIG. 8, is mated with the substrate sub-assembly shown in FIGS. 3 and 4. This is shown by way of illustration in FIG. 9 wherein the thin flexible dielectric film 30 having the integrated chip 42 bonded to the third layer of metallization 36 on the upper surface 40 thereof is placed on top of substrate sub-assembly including the insulating dielectric layer 26. After proper alignment of the conductor pattern of the second layer of metallization 34 on under side 38 of the flexible film 30, heat and pressure is applied to the points 48 by means of a thermocompression bonding tool 50 having a plurality of projections 52 extending from the face thereof. The points 48 are in registry with the windows 28 whereupon a thermocompression bond is made at each of the respective bonding points 48 by the bonding tool 50 between selected conductors of the second layer of metallization 34 on the under side 38 of the flexible film 30 and selected conductors of the first layer of metallization 22 on the upper surface 24 of the substrate 20. This process and the completed assembly is shown in FIG. 11. The flexible film 30 having metallization on both sides of the film and in the throughholes in an uninterrupted manner provide an interconnection between the metallization pads 44 on the integrated circuit chip 42 with the conductors of the first metallization layer 22 of the substrate 20 rather than a direct electrical connection between the chip and the metallization on the substrate. After electrical testing, the final assembly package may be hermetically sealed and ready for use. Additionally, when desireable, the assembly shown in FIG. 9 can be mounted in a metal can or other type of housing, not shown.

Although the present invention has been shown considering a single dielectric film with appropriate metallization for interconnecting an integrated circuit chip to the metallization circuitry on the substrate, it is also within the scope of the present invention to employ more than one flexible dielectric film in a stacked configuration if more circuitry layers are required. This depends upon the particular requirement and chip density desired.

Having disclosed what is at present considered to be the preferred embodiment of the subject invention, it should be pointed out that fewer and simpler processing steps are required than on other current multilayer microcircuit packaging techniques. Also presently existing pinhole problems in dielectric layers are eliminated with the discrete flexible film. Also as was pointed out above no restrictions are put upon the integrated circuit chip configurations utilized since plain chips may be successfully interconnected along with chips having bumps or beam leads. The compliant characteristic of the dielectric film allows for simultaneous bonding to any type of chip terminal areas. It also allows for simultaneous bonding of all interconnecting points on a flexible film to circuitry on the base substrate as was pointed out in detail.

Since the interconnected flexible film sub-assembly can be electrically tested prior to bonding to the rigid substrate base sub-assembly, automated manufacture and automated tests are possible on the dielectric film sub-assembly as well as on the final assembly, which has the attended advantage of providing greater reliability. Finally, since the number of processes are reduced and most of these processes are automatable, the cost of manufacturing a throw away modular microcircuit package is reduced, thus enhancing the desirability for a modular package produced in accordance with the teachings of the subject invention.

We claim as our invention:

1. A microcircuit modular package comprising in combination:

a relatively rigid substrate of insulating material having a first layer of metallization configured in a predetermined conductor pattern on one surface thereof;

an insulating dielectric layer disposed on top of said first layer of metallization intermediate the extremities thereof and having a predetermined window pattern fabricated in said dielectric layer exposing selected regions of said conductor pattern of said first layer of metallization;

at least one flexible dielectric film having a selected pattern of throughholes provided therein and including metallization applied to both sides of said flexible film as well as in said throughholes defining a second or lower and a third or upper interconnected layer of metallization, said second and third layer of metallization being configured in predetermined conductor patterns respectively on each side of the flexible film with selected conductors on one side being selectively connected to conductors on the other side by said throughholes;

an integrated circuit chip including electrical contact means electrically connected to one layer of metallization on said flexible dielectric film; and said flexible film being located over said substrate with said second layer of metallization being contiguous with said insulating dielectric layer, said conductor pattern of said second layer of metallization being selectively aligned with said window pattern and said exposed regions of conductor pattern of said first layer of metallization and being electrically connected thereto at the location of said window pattern in said insulating dielectric layer.

2. The invention as defined by claim 1 wherein said integrated chip is attached to said flexible dielectric film and electrically connected to the conductor pattern of said third layer of metallization.

3. The invention as defined by claim 1 wherein said flexible dielectric film is comprised of a plastic material having a high temperature characteristic and which is etchable.

4. The invention as defined by claim 1 wherein said flexible dielectric film is comprised of a relatively this sheet of polypyromellitimide.

5. The invention as defined by claim 4 and wherein said insulating dielectric layer comprises a prefabricated layer of dielectric film.

6. The invention as defined by claim 4 and wherein said insulating dielectric layer is comprised of a film of polymer material fabricated on and bonded to the surface of said substrate including said first layer of metallization.

7. The invention as defined by claim 4 wherein said substrate, said insulating dielectric layer and said flexible dielectric film are arranged in a stacked configuration.

8. The invention as defined by claim 1 wherein said relatively rigid substrate of insulating material is comprised of ceramic material.

9. The invention as defined by claim 1 wherein said electrical contact means of said chip comprises metallization pads.

10. The method of manufacturing a microcircuit package including an integrated circuit chip comprising the steps of:

a. fabricating a first layer of metallization on a rigid substrate of ceramic material and producing a metal conductor pattern from said first layer of metallization;

b. locating an insulating layer of dielectric material having a selected pattern of windows therein on said substrate, being contiguous with said first layer of metalization and whereby said selected pattern of openings exposes selected regions of said conductor pattern;

c. producing a selected throughhole pattern in a flexible dielectric film;

d. producing a second or lower and a third or upper layer of metallization on each side of said flexible film respectively as well as in the throughhole pattern for producing metallization continuity between both sides of said flexible film;

e. producing a selected conductor pattern on said first and second layers of metallization whereby selected conductors on one side of said flexible dielectric film are connected to selected conductors on the opposite side of said flexible film through said throughhole pattern;

f. bonding the electrical connector means of an integrated circuit chip to the selected conductor pattern on one side of said flexible film; and g. bonding the conductor pattern of said second layer of metallization to the exposed regions of said microstrip conductor pattern of said first layer of metallization on said substrate whereby electrical connection is made between said first layer of metallization and said integrated circuit chip.

11. The method as defined by claim 10 and additionally including the step of:

locating the integrated circuit chip on said flexible dielectric film and attaching said chip to said flexible film to form a sub-assembly thereby, simultaneously with the bonding of the electrical connector means to said conductor pattern.

12. The method as defined by claim 10 and additionally including the step of:

f'. mounting said flexible film sub-assembly on top of said substrate including said first layer of metallization and said insulating layer; and wherein step (g) comprises applying a thermocompression bonding tool on top of said flexible film for simultaneously making a plurality of electrical and mechanical bonds between the conductor pattern of said second layer of metallization and said conductor pattern of said first layer of metallization on said substrate.

13. The method as defined in claim 12 wherein said step (f') additionally includes inverting said flexible dielectric film prior to mounting said sub-assembly on top of said substrate whereby said chip is adjacent said substrate and bonding said chip to said substrate for providing maximum heat conduction.

* * * * *